United States Patent [19]

Asick et al.

[11] Patent Number: 4,475,781

[45] Date of Patent: Oct. 9, 1984

[54] BUSSING SYSTEM FOR STACKED ARRAY OF PANEL BOARDS

[75] Inventors: John C. Asick, Harrisburg; George H. Douty, Mifflintown; Joseph R. Goodman, Lake City; Kermit M. Jones, Jr.; John M. Landis, both of Camp Hill; Clair W. Snyder, Jr., York; John A. Woratyla, Camp Hill; Dale R. Zell, Elizabethtown, all of Pa.

[73] Assignee: AMP Incorporated, Harrisburg, Pa.

[21] Appl. No.: 447,921

[22] Filed: Dec. 8, 1982

[51] Int. Cl.³ .......... H05K 1/08

[52] U.S. Cl. .......... 339/17 LM; 339/17 M; 339/19

[58] Field of Search .......... 339/19, 222, 17 M, 17 LM

[56] References Cited

U.S. PATENT DOCUMENTS

| | | | |
|---|---|---|---|
| 3,245,024 | 4/1966 | Evans | 339/17 LM |
| 3,404,367 | 10/1968 | Henschen | 339/256 R |
| 3,609,463 | 9/1971 | Labove | 339/17 LM X |
| 3,634,816 | 1/1972 | Zell | 339/187 M X |
| 3,858,154 | 12/1974 | William | 339/17 LM |
| 4,133,592 | 1/1979 | Cobaugh et al. | 339/17 M |
| 4,186,982 | 2/1980 | Cobaugh et al. | 339/17 C |
| 4,412,712 | 11/1983 | Reimer et al. | 339/17 M |

FOREIGN PATENT DOCUMENTS

| | | | |
|---|---|---|---|
| 8001022 | 5/1980 | Japan | 339/17 M |

*Primary Examiner*—William R. Briggs

*Attorney, Agent, or Firm*—Russell J. Egan

[57] ABSTRACT

A bussing system for interconnecting pairs of circuit boards in a closely spaced array of parallel spaced circuit boards is formed by a bussing connector for each pair of circuit boards and a pair of blade headers on each circuit board. The first header is mounted on a first side of a respective circuit board and the second header is mounted aligned on the opposite side of the circuit board. Each header is provided with a plurality of terminals having one end in electrical contact with the circuitry of the circuit board and an opposite end projecting from the respective header. The bussing connector has a housing containing a plurality of terminals each arranged to engage a terminal extending from a first header of a first circuit board and a terminal extending from a second header of an adjacent second circuit board.

6 Claims, 5 Drawing Figures

BUSSING SYSTEM FOR STACKED ARRAY OF PANEL BOARDS

The present invention concerns a bussing system which will allow circuit boards in a closely spaced stacked array to be selectively bussed together.

Modern technological developments are calling for higher density arrays of circuit boards, often with the requirement that adjacent circuit boards be selectively bussed together to conserve on both space and materials. The typical arrangement has had a closely spaced array of terminals and then used a series of edge board connectors mounted on a cable and daisy chain fashion to selectively interconnect the various circuit boards. This often causes a multiplicity of problems in that the cable interferes with ready access to the circuit board and versatility in making the interconnects is restricted.

The present invention is comprised of a pair of profiled blade headers which are mounted on opposite sides of a circuit board and which mate with a bussing member connected intermediate pairs of circuit boards. The first profiled blade header includes an elongated member of rigid insulative material having a plurality of blade-like terminals mounted therein in fixed parallel spaced relationship. Each terminal has a mating blade portion extending from one surface of the header and an oppositely directed compliant pin portion extending from the opposite face of the header and adopted to mechanically and electrically interconnected with conductive holes in the circuit board. The second profiled blade header is substantially identical to the first profiled blade header with the differences being in dimensions. The second profiled header has an elongated member of rigid insulative material and a plurality of terminals mounted therein in parallel spaced relation with each terminal having a blade portion extending from a first surface and an oppositely directed compliant section extending from an opposite face to mate with a conductive aperture in the circuit board. The bus member can be fixedly mounted on a plate or shelf and would be positioned between a pair of circuit boards. The bus member includes an insulative member defining a plurality of parallel slots each of which receives therein a bussing terminal having a pair of parallel spaced blades each of which receives in electrical and mechanical contact a blade of a first profiled header and a second profiled header to two adjacent circuit boards to provide bussing therebetween.

The present invention will be described by way of non-limiting example with reference to the accompanying Figures in which.

Figure 1:
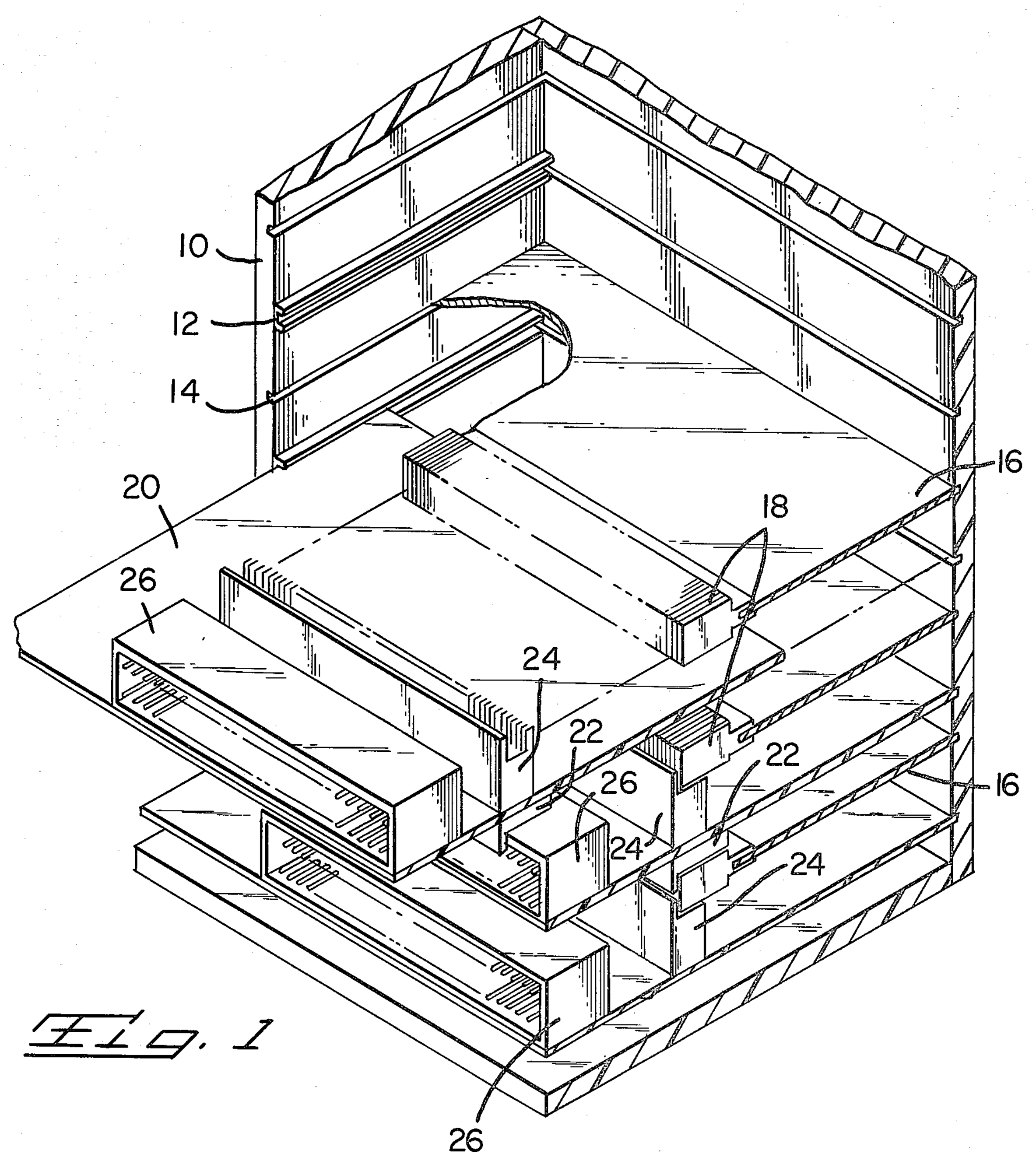
FIG. 1 is a perspective view of a frame or chassis incorporating the present invention for bussing together a series of circuit boards.

The present invention is shown in its environment in FIG. 1. This Figure shows a portion of a cabinet or chassis 10 having a plurality of parallel spaced circuit board receiving channels 12 and/or grooves 14, and a series of plates or panels 16 are mounted in the grooves 14 intermediate the channels 12. Each plate 16 has a bussing member 18 mounted on the free end thereof. Each circuit board 20 has a first, low profile blade header 22 and a second, high profile blade header 24 mounted aligned on opposite sides of the same portion of a circuit board 20. The circuit board further has an IO connector 26 at an edge portion thereof.

The bussing connector 18 of the present invention is formed by an elongated member 28 of rigid insulative material having a slot 30 in one edge thereof to receive therein an edge portion of the mounting plate 16. The opposite edge of the member 28 is formed with a plurality of parallel spaced webs or fins 32 which extend to opposite sides of the normal to the member 28 and define terminal receiving passages 24 therebetween. The bussing connector 18 also includes a plurality of bussing terminals 36 formed of conductive material each having a pair of parallel spaced tines 38, 40 joined by an integral cross bar portion 42. The terminals 36 are mounted in the bussing connector 18 to lie in the passages 34 with the tines 38, 40 lying on opposite sides of the member 28.

Figure 2:
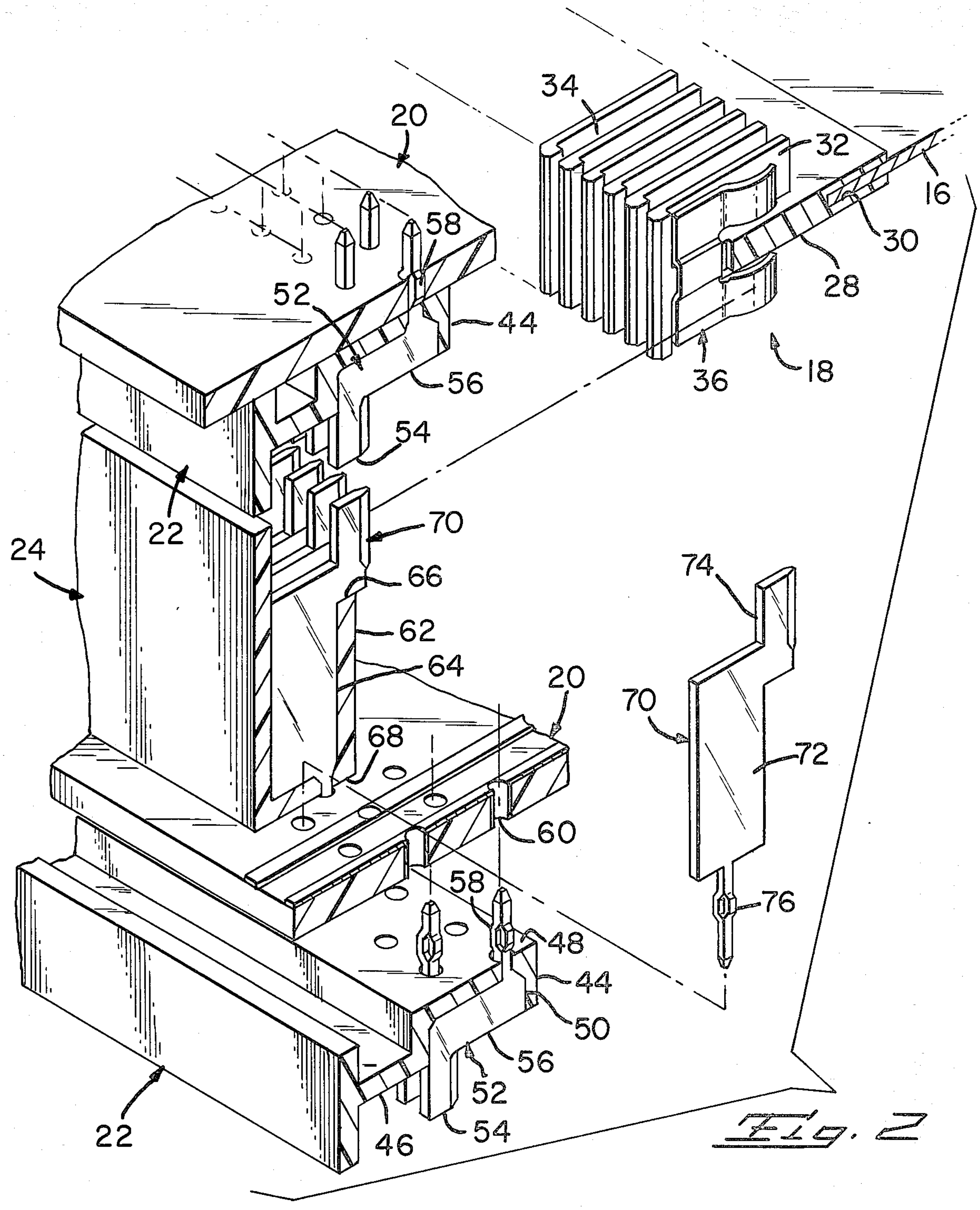
FIG. 2 is an exploded perspective view, partially in section, showing the elements of the present invention.
Figure 3:
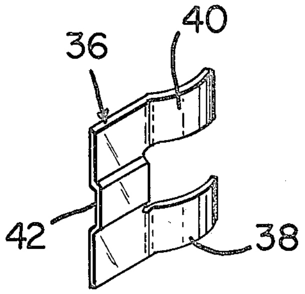
FIG. 3 is a perspective view of a bussing terminal used in the present invention.
Figure 4:
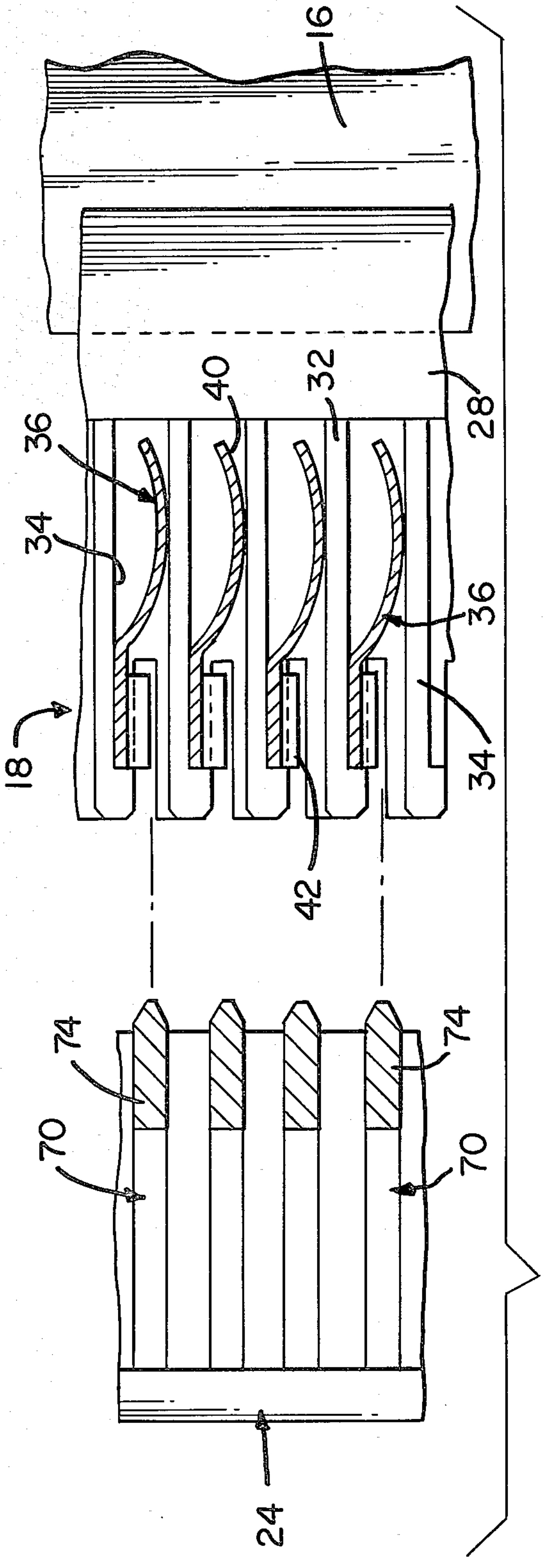
FIG. 4 is a plan view, partially in section, showing a header exploded from a bus connector.
Figure 5:
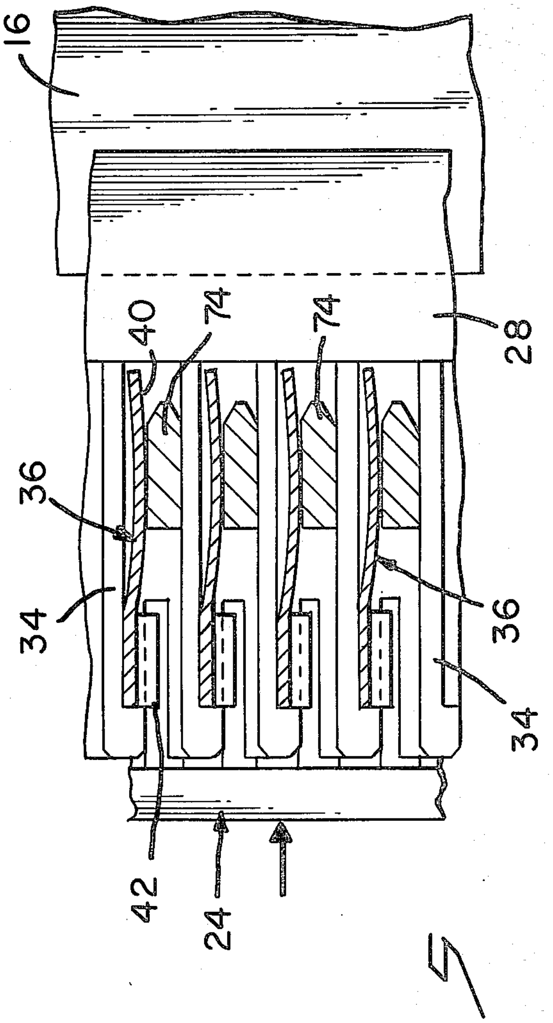
FIG. 5 is a view similar to FIG. 4 showing the header and bussing connector in the mated condition.

The first, low profiled blade header 22 is formed by an elongated member 44 of rigid insulative material defining a mating face 46 and an oppositely directed mounting surface 48. A plurality of conductor passages 50 are formed in parallel spaced relationship in the member 44 extending between the face 46 and surface 48. A like plurality of blade terminals 52 are each mounted in a respective passage 50, each having a blade portion 54 extending from the mating face 46, a body portion 56 lying within the member 44, and a compliant pin portion 58 extending from the surface 48. It should be noted that the terminal body 56, as shown in FIG. 2, provides an offset between the blade portion 54 and the compliant pin portion 58. The adjacent terminal would have these members more in line. The result is all of the blade portions 54 being aligned on the mating face 46 while the compliant pin portions 58 are in staggard rows on surface 48. The compliant pin portions 58 are aligned to be received in the conductive apertures 60 of the circuit board 20.

The second, high profiled blade header 24 is similar in nature to the first blade header 22 is shown with dimensional changes. Both headers could be exactly alike. Header 22 is formed by an elongated member of rigid plastics material 62 defining a plurality of terminal passages 64 extending between oppositely directed mating face 66 and mounting surface 68. The second header 24 includes a plurality of terminals 70 each of which has a body 72 with a blade 74 extending from one end thereof and a compliant pin 76 extending from the opposite end thereof. As with the terminals 52, the compliant pin portions 76 are aligned on the body 72 to form staggard rows extending from surface 68 so as to be in proper alignment with the conductive apertures 60 of the circuit board 20. Each first and second header can be provided with mounting means (not shown) and both headers and the bussing connector are preferably polarized or keyed.

The present invention is utilized in the following manner. The bussing connectors 18 are mounted on the plate 16 within the chassis 10. Each circuit board 20 is provided with a first profiled blade header 22 on a first side and a second profile blade header 24 on the opposite side with the compliant pin portions 58, 76 of the respective terminals 52, 70 engaging in the respective holes 60 of the circuit board 20. It will be noted, in particular, that when mounted that the blades 54, 74 of the respective terminals 52, 70 will be oppositely directed from the circuit board 20 but will be in alignment with each other. The circuit board is completed by an IO connector 26 of known configuration. When the completed circuit board 20 is inserted into the chassis 10, the edges of the circuit board will slide through the guide channels 12 bringing the first blade header 22 and second blade header 24 into alignment and with an engagement with respective bussing connectors 18. Each bussing connector 18 will receive a header from a circuit board with the blades 40, as shown in FIG. 2 engaging the blade 54 of the first profile header 22 and the tine 38 engaging the blade 74 of the second profiled blade header 24.

It will be noted by those skilled in the art that the configurations of the three terminals as well as the respective headers and connectors of the present invention are all of an uncomplicated configuration making them very easy to produce and assemble in a rapid and economical fashion.

We claim:

1. A bussing system for interconnecting a plurality of adjacent parallel spaced circuit boards together in pairs, said system comprising:

a bussing connector mounted to receive a circuit board on opposite sides thereof, said bussing connector having an elongated member of rigid insulative material forming a plurality of parallel fins extending from opposite faces of said elongated member and defining terminal receiving cavities therebetween, a terminal mounted in each said cavity with a blade engaging tine between each fin;

first and second profiled blade terminal headers formed of rigid non-conductive material, each header having an elongated profile with oppositely directed mounting and mating faces, a plurality of terminal passages extending through each header between said faces; and a like plurality of terminals each having a body portion with a blade extending therefrom in a first direction and a compliant pin portion extending therefrom in an opposite direction, each said terminal being mounted in a respective passage with said blade portion extending from said mating face and said compliant pin portion extending from said mounting face, said headers being mounted aligned on opposite sides of said circuit board with the compliant pin portions of the terminals being received in respective conductive apertures of said circuit board, said blade portions of the headers on opposite sides of a circuit board being in alignment, whereby circuit boards positioned adjacent opposite sides of said bussing header are interconnected by a blade portion of a first header on a first circuit board and a blade portion of a second header on a second circuit board.

2. A bussing system according to claim 1 wherein one of said headers has a low profile and the bodies of said terminals are substantially parallel to the circuit board and the other of said headers has a high profile with the terminals received therein having their bodies extending substantially normal to the circuit board.

3. A bussing system according to claim 1 wherein said compliant pin portions and said blade portions of said terminals are offset so that the terminals on each side of the circuit board have their blade portions in alignment.

4. A bussing system according to claim 1 wherein said bussing connector housing and both said blade headers all have keying profiles.

5. A bussing system according to claim 1 further comprising:

means to mount said headers on opposite sides of a respective circuit board.

6. A bussing system according to claim 1 further comprising:

means to chassis mount said bussing connector.

* * * * *